United States Patent [19]

Mizuno

[11] 3,909,627

[45] Sept. 30, 1975

[54] TWO-PHASE DYNAMIC LOGIC CIRCUIT

[75] Inventor: Masatoshi Mizuno, Tokyo, Japan

[73] Assignee: Nippon Electric Company Incorporated, Tokyo, Japan

[22] Filed: Nov. 6, 1973

[21] Appl. No.: 413,207

[30] Foreign Application Priority Data

Nov. 10, 1972 Japan .............................. 47-113212

[52] U.S. Cl. ................ 307/205; 307/208; 307/214; 307/215; 307/218

[51] Int. Cl.[2] ............... H03K 19/08; H03K 19/40; H03K 19/34; H03K 19/36

[58] Field of Search ........... 307/205, 214, 208, 218, 307/246, 251, 203, 215, 221 C, 238; 328/176

[56] References Cited

UNITED STATES PATENTS

| | | | |
|---|---|---|---|
| 3,252,011 | 5/1966 | Zuk | 307/251 X |
| 3,582,674 | 6/1971 | Pound | 307/205 X |
| 3,629,618 | 12/1971 | Fujimoto | 307/246 X |
| 3,644,750 | 2/1972 | Campbell | 307/205 X |
| 3,646,369 | 2/1972 | Fujimoto | 307/279 X |
| 3,651,334 | 3/1972 | Thompson et al. | 307/205 X |
| 3,675,043 | 7/1972 | Bell | 307/214 X |
| 3,731,114 | 5/1973 | Gehweiler | 307/205 |
| 3,795,898 | 3/1974 | Mehta | 307/238 X |
| 3,801,964 | 4/1974 | Palfi et al. | 307/238 X |

FOREIGN PATENTS OR APPLICATIONS

| | | | |
|---|---|---|---|
| 461,767 | 6/1971 | Japan | 307/205 |

OTHER PUBLICATIONS

J. West, "Practical Circuit Design Using M.O.S. Design Electronics (publication); Vol. 8, No. 6; 3/1971; pp. 30–32, 37, 38.

*Primary Examiner*—Michael J. Lynch
*Assistant Examiner*—L. N. Anagnos
*Attorney, Agent, or Firm*—Hopgood, Calimafde, Kalil, Blaustein & Lieberman

[57] ABSTRACT

A two-phase dynamic logic circuit comprises first, second, and third MOS transistors and a logic means which includes an input terminal and an output terminal. The drain of the first transistor is connected to a D.C. voltage or to the first clock signal source and the gate of that transistor as well as the drain of the third transistor are connected to the first clock signal source. The sources of the first and second transistors are connected to the output terminal of the logic means.

The gate of the second transistor is connected to the second clock signal source, and the drain of that transistor is connected to the gate of the third transistor. The output signal of the circuit is derived from the source of the third transistor of the circuit is derived from the source of the third transistor.

8 Claims, 6 Drawing Figures

TWO-PHASE DYNAMIC LOGIC CIRCUIT

The present invention relates generally to logic circuits, and more particularly, to a two-phase dynamic logic circuit consisting of insulated-gate field effect transistors (hereinafter referred to as "IGFET's").

The use of integrated circuits consisting of IGFET's, typically MOS (metal-oxide-semiconductor) transistors, has been greatly increased in recent years. There are two principal factors for this increase. One is that in a circuit formed of MOS transistors, the insulating separation between the MOS transistors is unnecessary, so that the number of steps in the manufacturing process is low, the number of elements which can be formed per unit area is high, and the production yield is high. The other factor is that since direct wiring between the circuit stages is possible because of the nature of MOS transistors, the number of elements per unit function is significantly reduced.

In a conventional multi-phase dynamic gate employing only MOS transistors, the number of clock signals, which are required for preventing malfunction caused by charge-sharing and for carrying out complex logic functions rather than simple functions, as in a shift register, is three or more. The best known multi-phase dynamic logic circuits that has heretofore been proposed is a four-phase dynamic logic circuit. Since thie type of multi-phase dynamic logic circuit is normally constructed as a ratio-less circuit, it is characterized by low power consumption, an operating speed which is directly proportional to the frequency of the clock pulses, and a high maximum operating frequency. On the other hand, the four-phase logic circuit has shortcomings in that within the integrated circuit chip the number of P-N junctions to be connected to the clock signal generator is large, and consequently, the junction capacitance and the load capacitance of the clock signals are increased. Because of this fact, when the circuit is driven with a large amplitude signal at a high speed, a driving circuit employing a transistor having a high breakdown voltage and a high switching speed is required, resulting in a high manufacturing cost. Still further, a four-phase logic circuit of this type requires four such expensive driving circuits. In addition, when wiring four clock signal lines within an integrated circuit chip, the mutual crossing between the clock signal lines must be avoided in order to minimize the delay of the clock signals. This results in a restriction in the freedom in the design of the circuit layout. In addition, substantial attention must be paid to prevent interference between the clock signal lines and the other signal lines.

It is an object of the present invention to provide a two-phase dynamic logic circuit employing IGFET's, in which the entire logic circuit can be driven by only two phases of clock pulse signals each having a different phase.

It is a further object of the invention to provide a two-phase dynamic logic circuit of the type described which provides reduced power consumption and high speed operation, comparable to conventional multi-phase dynamic logic circuits.

The two-phase dynamic logic circuit according to the present invention comprises first, second, and third IGFET's. First and second clock signal sources generate clock signals having respective phases different from each other. The circuit includes logic means which includes at least one input terminal and an output terminal, the output terminal being connected to the sources of the first and second IGFET's. The drain of the first IGFET is connected to a D.C. voltage source or to the first clock signal source, and the gate of that transistor and the drain of the third IGFET are connected to the first clock signal source. The gate of the second IGFET is connected to the second clock signal source, and the drain of that transistor is connected to the gate of the third IGFET. The output signal of the logic circuit is derived from the source of the third IGDFET.

The dynamic logic circuit according to the present invention can operate under the control of two-phase clock signals. Consequently, the clock-pulse generating circuits are simplified, and the number of external connection terminals is reduced when the circuit is fabricated as an integrated circuit chip. In addition, the wirings for the clock signals formed within an integrated circuit chip are reduced in number in comparison to the prior art, and the circuit design thereby becomes less complex. The acceptability of two-phase clock signals results in the reduction of the time period per one cycle to one-half as small as that in the case of four-phase clock signals, and accordingly, the operating frequency of the logic circuit is doubled with respect to the conventional dynamic logic circuit employing four-phase clock signals. Furthermore, the switching speed of the two-phase circuit of the invention can be independently selected at the input and output sides, respectively, and therefore, the design of the logic circuit becomes easier. Also, with an increased load, it is only necessary to change the design of the circuit on the output side. In addition, since the number of P-N junctions connected to the terminals to which the clock signals are applied is small, the consumption of electric power for charging and discharging the junction capacitances is reduced.

The foregoing and other objects, features and advantages of the invention will be apparent from the following more detailed description of preferred embodiments of the invention as illustrated in the accompanying drawings, in which.

Although P-channel MOS transistors are herein specifically employed by way of example as the IGFET's in the dynamic logic circuit in the following description, the basic concept of the present invention is obviously equally applicable to N-channel MOS transistors and other types of IGFET's.

Figure 1:
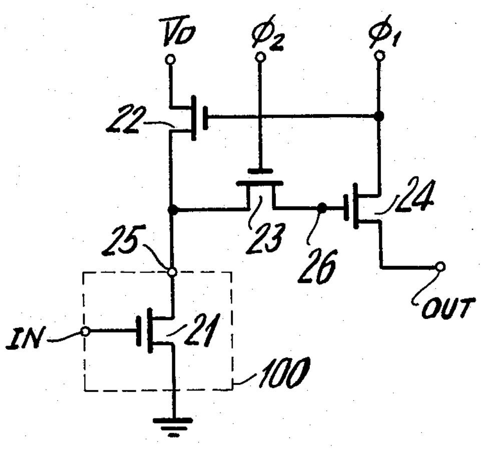
FIG. 1 is a circuit diagram of a two-phase dynamic logic circuit according to one embodiment of the present invention.

Referring now to FIG. 1, the source of a P-channel MOS transistor (hereinafter referred to simply as "transistor") 21 is grounded. Transistor 21 constitutes a NOT logic device 100. The gate and the drain of transistor 21 is connected to an input terminal IN and to an output terminal 25 of the logic device 100, respectively. The output terminal 25 is connected through the source-drain path of a load transistor 22 to a negative D.C. voltage source $V_D$. Although D.C. voltage $V_D$ is applied to the drain of transistor 22 in this particular embodiment, a clock signal $\phi_1$ may be instead applied thereto.

The source of a transistor 23 is also connected to terminal 25, and the gate of a transistor 24 is connected to the drain of transistor 23 at a point 26. A clock signal $\phi_1$ is applied to the gate of load transistor 22 and to the drain of transistor 24, while a clock signal $\phi_2$ is supplied to the gate of transistor 23. An input signal is applied to input terminal IN connected to the gate of transistor 21, while an output signal is derived from an output terminal OUT connected to the source of transistor 24.

Figure 3:
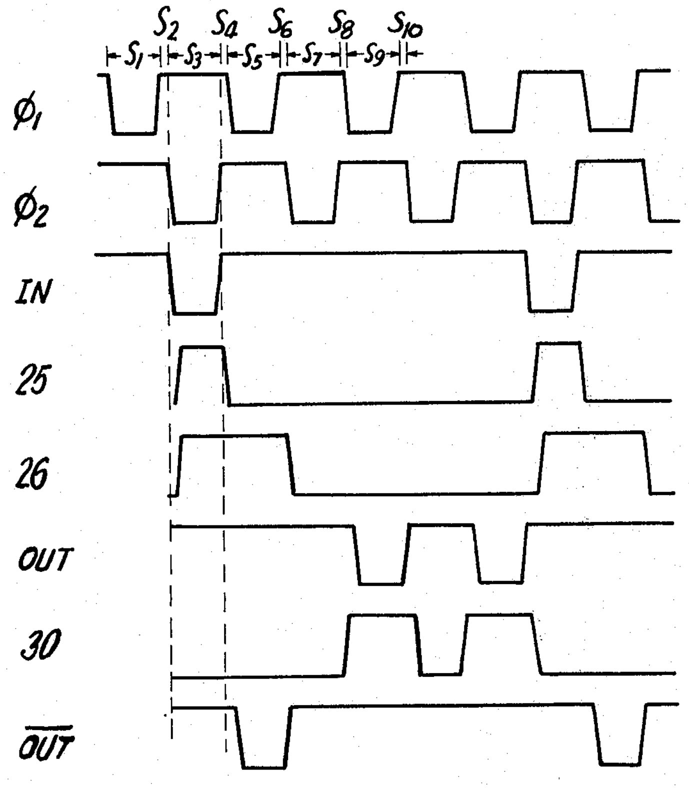
FIG. 3 is a wave form diagram for explaining the operations of the circuit arrangements illustrated in FIGS. 1 and 2.

The operation of the circuit of FIG. 1 will now be described with reference to the waveform diagram of FIG. 3. The clock signals $\phi_1$ and $\phi_2$ consist of pulses having approximately opposite phases to each other except for the rise time and fall time portions. More particularly, during the period $S_1$, the clock signal $\phi_1$ has a negative potential (low level), while the clock signal $\phi_2$ is at zero potential (high level). But during the period $S_3$, the clock signal $\phi_1$ is at zero potential, while the clock signal $\phi_2$ is at a negative potential. In the illustrated clock signals, between the rise time of the first clock signal $\phi_1$ and the fall time of the second clock signal $\phi_2$, there is a certain period of time $S_2$ during which both clock signals are at zero potential. Similarly, between the subsequent rise time of the second clock signal $\phi_2$ and the subsequent fall time of the first clock signal $\phi_1$, there is a similar period of time $S_4$ during which both clock signals are at zero potential.

According to this time relationship, successive time periods designated by $S_5$, $S_6$, $S_7$ . . . follow time periods $S_1$, $S_2$, $S_3$ and $S_4$. The necessity for the time periods $S_2$, $S_4$, $S_6$, $S_8$, $S_{10}$, will become apparent later in connection with the description of the operation of the modified embodiment of the invention illustrated in FIG. 2.

During the period $S_1$, since the clock signal $\phi_1$ is at a negative potential, the transistor 22 is conducting and the output point 25 of logic device 100 is precharged to a negative potential. During the period $S_2$, transistors 21, 22 and 23 are nonconductive, and the negative charge precharged at point 25 is not varied. During the period $S_3$, the clock signal $\phi_2$ is at a negative potential, and transistor 23 is accordingly conducting. In the same period, an input signal of a negative potential is applied to the input terminal IN. Accordingly, the transistor 21 becomes conductive, so that the negative charge precharged at points 25 and 26 is discharged through the source-drain paths of transistors 23 and 21 until these points are at zero potential. Consequently, the transistor 24 becomes non-conductive, and a signal opposite in polarity to the input signal appears at point 26.

In the period $S_4$, the clock signal $\phi_2$ is at zero potential, so that transistor 23 becomes nonconductive and the signal potential at point 26 is not discharged. During the period $S_5$, the clock signal $\phi_1$ has a negative potential, but the output terminal OUT is not changed from its initial state at zero potential because the transistor 24 is maintained nonconductive. This can be otherwise expressed that the output in the period $S_5$, which is delayed by one-half bit time with respect to the input signal at a negative potential in the period $S_3$, is zero potential. During the period $S_7$, when the input signal is zero potential, the clock signal $\phi_2$ has a negative potential so that transistor 23 is conductive, but transistor 21 is kept nonconducting because of the zero potential of the input signal. Therefore, during the period $S_5$, the negative electric charge precharged at point 25 does not vary toward ground potential, but moves to point 26, resulting in a negative potential at point 26.

Transistor 24 then becomes conductive, but the output terminal OUT is not charged from its initial state of zero potential because the clock signal $\phi_1$ is at zero potential. In the period $S_8$, the clock signal $\phi_2$ has a zero potential, so that transistor 23 becomes nonconductive and the negative potential at point 26 is retained. In the next period $S_9$, since the clock signal $\phi_1$ takes a negative potential and since transistor 24 is already conducting because of the negative charge preserved at the gate of transistor 24, the output terminal OUT is charged to a negative potential.

In the period $S_{10}$, the clock signal $\phi_1$ is at a zero potential and the output terminal OUT thereby is charged to a zero potential. Thus, in response to an input signal of zero potential applied to the input terminal IN during the period $S_7$, an output of negative potential results in the period $S_9$ with a time delay of one-half bit time. Therefore, it will be readily appreciated that if the circuit shown in FIG. 1 is cascaded with a similar circuit having its clock signals $\phi_1$ and $\phi_2$ interchanged, an output signal having a time delay of one bit time with respect to the input signal will be obtained, and such a cascaded circuit is useful as a shaft register or a D-type flip-flop.

Figure 2:
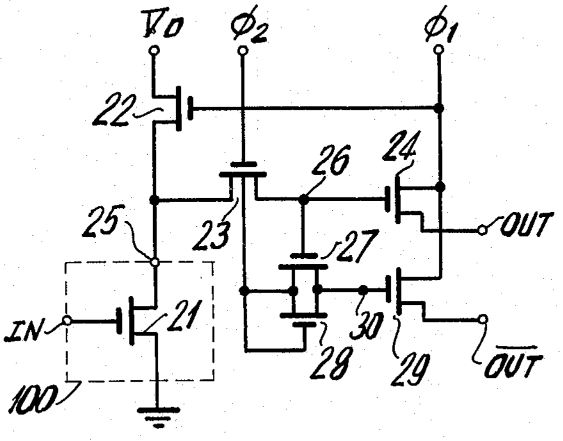
FIG. 2 is a circuit diagram of a two-phase dynamic logic circuit according to another embodiment of the present invention.

When an output having the same polarity as the input is desired for the logic circuit of FIG. 1, the output can be obtained by further adding three transistors 27, 28 and 29 to the circuit of FIG. 1, as illustrated in the circuit of FIG. 2. More particularly, in the circuit of FIG. 2, the source (or drain) of the transistor 27, the source (or drain), and the gate of the transistor 28 are jointly connected to the gate of transistor 23 corresponding to the transistor having the same reference numeral in the circuit of FIG. 1. Point 26 is connected to the gate of transistor 27, and the drain of transistor 24 is connected to the drain of transistor 29 whose gate connected to a point 30 is in turn connected to the drains (or sources) of transistors 27 and 28. In addition, a second output terminal $\overline{\text{OUT}}$ is connected to the source of transistor 29.

The operation of the circuit of FIG. 2 will now be described with reference also to FIG. 3. The clock signals $\phi_1$ and $\phi_2$ and the input signal are the same as those in the circuit of FIG. 1. Accordingly, the waveforms of the signals appearing at the points 25 and 26, respectively, and of the output signal at the output terminal OUT are also the same as those described in connection with the circuit of FIG. 1. During the period $S_3$, the clock signal $\phi_2$ takes a negative potential, so that point 30 is charged to a negative potential via transistor 28. During the period $S_4$, since point 26 is at zero potential, transistor 27 is nonconductive. Therefore, the negative charge held at point 30 cannot be discharged, and the transistor 29 is thereby conductive. At this point of time, since the clock signal $\phi_1$ is at zero potential, the second output terminal $\overline{\text{OUT}}$ is not changed from its initial state at zero potential. During the next period $S_5$, the clock signal $\phi_1$ turns to a negative potential, and the second output terminal $\overline{OUT}$ takes a negative potential because transistor 29 is already conducting. In the period $S_6$, since the clock signal $\phi_1$ is at zero potential, the second output terminal $\overline{OUT}$ is shifted to zero potential. Consequently, the second output signal during the period $S_5$ is opposite in polarity with respect to the output signal at the output terminal OUT in the circuits of FIGS. 1 and 2. If point 26 is at a negative potential, as is the case during the period $S_8$, the negative charge at point 30 charged through transistor 28 flows to the signal source of the clock signal $\phi_2$ via the transistor 27, and point 30 is thereby returned to zero potential. Accordingly, transistor 29 changes from a conducting state to a nonconducting state, and the second output terminal $\overline{OUT}$ is not changed from zero potential. During the period $S_9$, the clock signal $\phi_1$ is turned to a negative potential, but the second output terminal $\overline{OUT}$ is not changed from zero potential because the transistor 29 is then nonconductive. Therefore, the second output signal during the period $S_9$ at the second output terminal $\overline{OUT}$ is opposite in polarity with respect to the output signal at the output terminals OUT in the circuits of FIGS. 1 and 2.

Figure 4:
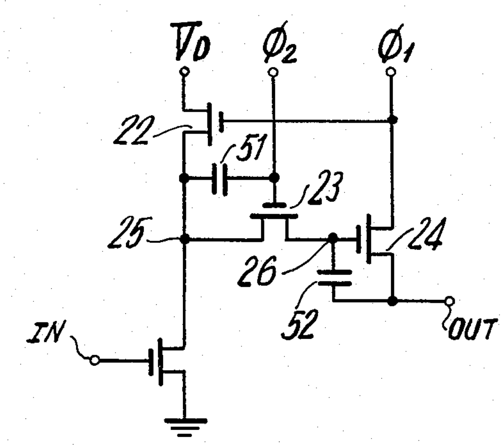
FIG. 4 is a circuit diagram of a two-phase dynamic logic circuit according to a further embodiment of the present invention.

Now with reference to FIG. 4, the modified embodiment shown in this figure is characterized in that the operation margin of the circuit is enhanced by additionally connecting capacitors 51 and 52 between the sources and the gates of the transistors 23 and 24, respectively, in the circuit of FIG. 1. More particularly, the capacitor 51 serves as a pull-up capacitance for point 25, which is effective for fully charging up point 26 when transistor 21 is in the nonconductive state. Capacitor 52 serves as a positive feedback capacitance which prevents transistor 24 from pinching-off by positively feeding back the output level at the output terminal OUT to the gate of transistor 24, and the capacitor 52 is thus effective to derive the amplitude of the clock signal $\phi_1$ per se as a logic amplitude at the output terminal OUT. It is apparent that even without capacitors 51 and 52 in the circuit, the two-phase dynamic logic circuit according to the present invention can operate in a satisfactory manner, although the provision of these capacitors is preferable.

Figure 5:
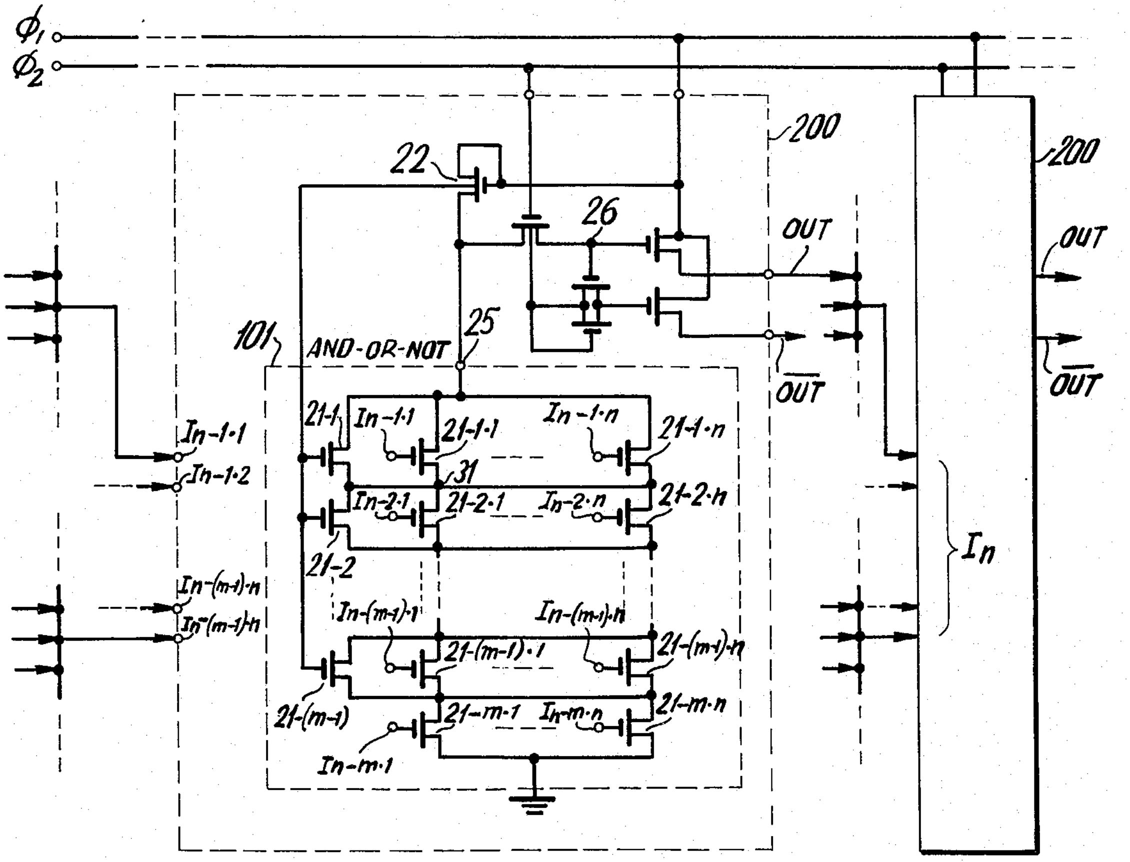
FIG. 5 is a circuit diagram of a two-phase dynamic logic circuit according to still a further embodiment of the present invention.

Referring now to FIG. 5, *a*, logic network 101 is used in place of the NOT logic device 100 in the circuit of FIG. 2. The logic device 101 consists of $m \times n$ transistors 21-1.1, 21-1.2, . . . 21-1.n; 21-2.1, 21-2.2 . . . 21-1.n; . . . ; 21-m.1, 21-m.2, . . . 21-m.n arranged in the form of a matrix of *m*-rows and *n*-columns and additional $(m-1)$ transistors **21-1, 21-2, . . . 21-(*m*.1). The drain of transistor 22 is connected to the source of the clock signal $\phi_1$ in place of the negative voltage source $V_D$, as mentioned with respect to the circuit in FIG. 1. The transistors in logic network 101 included in each column of the matrix array of transistors are connected in series, whereas the transistors included in each row are connected in parallel, and the additional transistors 21-1, 21-2, . . . 21-(*m*-1) are connected in parallel to the respective transistor rows, respectively, in the matrix array of transistors except for the mth row. The clock signal $\phi_1$ is applied to the respective gates of the additional transistors 21-1, 21-2, . . . 21-(*m*-1)**, whereas the respective gates of the transistors in the matrix array are supplied with input signals.

It will be obvious to those skilled in the art that logic network 101 works as an AND-OR-NOT logic and an AND-OR-NOT logic output is obtained at the output terminal OUT of the circuit 200 with a time delay of one-half bit (in the case where 1 level of binary input and output signals is zero potential and 0 level is a negative potential).

Assuming that the additional transistors 21-1, 21-2, . . . 21-(m-1) are not provided in the circuit of FIG. 5, although the node capacitance at output point 25 is precharged in response to the clock signal $\phi_1$, the node capacitance within logic network 101, for example, the node capacitance at point 31 between the source of transistor 21-1.1 and the drain of transistor 21-2.1, cannot be precharged. During the next sampling period when the clock signal $\phi_2$ becomes negative, if the transistor 21-1.1 is turned on but a complete discharge path is not established between point 25 and ground in response to a particular input condition, the electric charge which has been precharged on the node capacitance at point 25 flows through transistor 21-1.1 to the other node capacitances within logic network 101 which have not been precharged (for instance, the node capacitance at point 31), and the electric charge is shared by two or more node capacitances in proportion to the respective capacitance values. That is, charge-sharing occurs among the node capacitances. Consequently the potential sampled on the node capacitance at point 26 takes an intermediate potential between zero potential and a negative potential, resulting in a maloperation in the next stage. The charge-sharing problem is resolved in the illustrated circuit by applying the clock signal $\phi_1$ to the respective gates of the additional transistors 21-1, 21-2, . . . 21-(m-1) to precharge all the node capacitances within logic network 101 simultaneously with the precharging of the node capacitance at output point 25 of logic network 101.

It will be readily appreciated from the foregoing description that a logic output satisfying complex logic function can be obtained by combining the basic logic circuits 200 according to the present invention in cascade and/or parallel connections.

Figure 6:
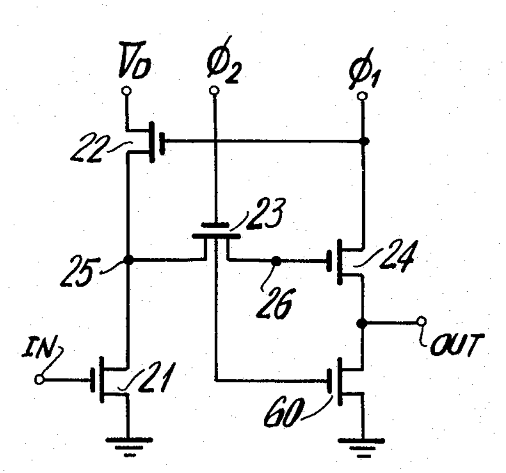
FIG. 6 is a circuit diagram of a two-phase dynamic logic circuit according to yet another embodiment of the present invention.

The circuit arrangement illustrated in FIG. 6 is different from the circuit illustrated in FIG. 1, in that an additional transistor 60 is connected between the output terminal OUT and ground; the gate of transistor 60 is supplied with the clock signal $\phi_2$. Transistor 60 is turned on in response to the negative potential of the clock signal $\phi_2$ to clamp the potential of the output terminal OUT at zero potential, and thereby maloperation of the circuit arrangement can be prevented. More particularly, since the logic circuits are often used in cascade, as generally shown in FIG. 5, the output lines including the output terminals OUT and $\overline{OUT}$ are elongated, and upon integrating, the circuit wirings must often be formed in a multi-layer structure. Accordingly, unnecessary negative voltage pulses may be induced on the output lines, resulting in maloperation of the circuit. In order to overcome this difficulty, transistor 60 is turned on only during the sampling period, i.e., the period when the clock signal $\phi_2$ is at a negative potential, and the output line is thereby clamped at zero potential.

In order to eliminate the undesired effect of these negative voltage pulses in the prior art four-phase dynamic logic circuit, it was necessary to connect an additional capacitance between the output line and a fixed potential source such as, for example, a D.C. voltage source or a ground. Accordingly, the degree of integration in the prior art four-phase circuit is significantly reduced. In contrast, this difficulty can be resolved in the logic circuit of the present invention by merely adding the transistor 60, so that the extreme reduction of the degree of integration is eliminated.

The advantages that can be obtained by the two-phase dynamic logic circuit according to the present invention are enumerated as follows:

First, in contrast to the fact that the prior art multiphase dynamic logic circuit required three or more clock signals having mutually different phases, the dynamic logic circuit according to the present invention can be driven by only two-phase clock signals. As a result of the reduction in the number of clock signals, the clock signal generator circuit is simplified in construction and the clock signal wiring within an integrated circuit chip can be made with two lines, whereby greater freedom is achieved in the design layout upon integrating the circuit arrangement.

A second advantage of the invention is that since it only requires the use of two clock signals $\phi_1$ and $\phi_2$ having mutually different phases, the operating speed over the dynamic logic circuit in the prior art employing three or more clock signals is possible.

A third advantage of the invention exists in the lower consumption of electric power. In the conventional multi-phase logic circuits, since the circuit portion corresponding to the grounded terminal in the circuit shown in FIG. 1 is connected to an external clock signal source, additional electric power for charging and discharging the P-N junction capacitance at this portion is consumed. Since this circuit portion is grounded in the logic circuit according to the present invention, this electric power consumption is eliminated.

A fourth advantage of the circuit according to the present invention is that in order to prevent the output line from being adversely affected by the negative voltage pulses it is only necessary to add a single transistor as described previously in the explanation of the circuit shown in FIG. 6. In contrast, in the conventional logic circuits, a large capacitance must be added and consequently the degree of integration is adversely reduced and the switching time is limited. However, the circuit arrangement according to the present invention is free from such disadvantages.

A fifth advantage of the invention is that because of the fact that the load for the logic networks, 100, 101 serving as the logic part and the output load are completely isolated from each other, there is no need to redesign the entire circuit arrangement, even in the event of an increased output load; instead it is only necessary in the circuit of the invention to design the transistors 24 and/or 29 at appropriate ratings.

The invention has been particularly shown and described with reference to preferred embodiments thereof. It will, however, be understood by those skilled in the art that the foregoing and other changes in form and details may be made therein without departing from the spirit and scope of the invention.

What is claimed is:

1. A two-phase dynamic logic circuit comprising first, second and third insulated-gate field effect transistors each having a drain, source and gate, a first clock signal source generating a first pulse and a second pulse succeeding said first pulse, a second clock signal source generating a third pulse between said first and second pulses, logic means having an input terminal and an output terminal, said output terminal of said logic means being connected to the sources of said first and second insulated-gate field effect transistors, the drain of said first insulated-gate field effect transistor being connected to one of a D.C. voltage source and said first clock signal source, the gate of said first insulated-gate field effect transistor and the drain of said thrid insulated-gate field effect transistor being connected to said first clock signal source, the gate of said second insulated-gate field effect transistor being connected to said second clock signal source, and the drain of said second insulated-gate field effect transistor being connected to the gate of said third insulated-gate field effect transistor, wherein in response to the input signal supplied to said input terminal of said logic means during the period of time when said third pulse is generated, an output signal is derived from the source of said third insulated-gate field effect transistor during the period of time when said second pulse is generated.

2. The two-phase dynamic logic circuit according to claim 1, further comprising fourth, fifth and sixth insulated-gate field effect transistors each having a gate, source and drain, the drains of said fourth and fifth insulated-gate field effect transistors and the gate of said fourth insulated-gate field effect transistor being respectively connected to the gate of said second insulated-gate field effect transistor, the sources of said fourth and fifth insulated-gate field effect transistors being respectively connected to the gate of said sixth insulated-gate field effect transistor, the gate of said fifth insulated-gate field effect transistor being connected to the gate of said third insulated-gate field effect transistor, and the drain of said sixth insulated-gate field effect transistor being connected to the drain of said third insulated-gate field effect transistor, wherein first and second output signals are derived from the sources of said third and sixth insulated-gate field effect transistors, respectively.

3. The two-phase dynamic logic circuit according to claim 2, in which said logic means comprises a seventh insulated-gate field effect transistor having a source connected to the ground, a drain connected to the output terminal of said logic means, and a gate connected to the input terminal of said logic means.

4. The two-phase dynamic logic circuit according to claim 2, in which said logic means comprises insulated-gate field effect transistors arranged in the form of a matrix of m-rows and n-columns (wherein *m* and *n* denote integers greater than 1) and (m-1) additional insulated-gate field effect transistors; the insulated-gate field effect transistors included in each column of said matrix being connected in series respectively, the insulated-gate field effect transistors included in each row of said matrix being connected in parallel respectively, said additional insulated-gate field effect transistors being connected respectively in parallel to the insulated-gate field effect transistors included in (m-1) numbers of said rows except for a single row of said matrix, the gates of said additional insulated-gate field effect transistors being connected to said first clock signal source, the gates of the insulated-gate field effect transistors arranged in said matrix being connected to said input terminals of said logic means respectively, the drains of the insulated-gate field effect transistors included in the first row of said matrix being connected to said output terminal of said logic means, and the sources of the insulated-gate field effect transistors included in said single row of said matrix being connected to ground.

5. The two-phase dynamic logic circuit according to claim 1, further comprising a first capacitor element connected between the gate and source of said second insulated-gate field effect transistor, and a second capacitor element connected between the gate and source of said third insulated-gate field effect transistor.

6. The two-phase logic circuit according to claim 1, further comprising a fourth insulated-gate field effect transistor having a gate, drain and source, the gate of said fourth insulated-gate field effect transistor being connected to the gate of said second insulated-gate field effect transistor, the drain of said fourth insulated-gate field effect transistor being connected to the source of said third insulated-gate field effect transistor, and the source of said fourth insulated-gate field effect transistor being grounded.

7. The two-phase dynamic logic circuit according to claim 1, in which said logic means comprises a fourth insulated-gate field effect transistor having a source connected to the ground, a drain connected to the output terminal of said logic means, and a gate connected to the input terminal of said logic means.

8. The two-phase dynamic logic circuit according to claim 1, in which said logic means comprises insulated-gate field effect transistors arranged in the form of a matrix of m-rows and n-columns (wherein *m* and *n* denote integers greater than 1) and (m-1) additional insulated-gate field effect transistors, the insulated-gate field effect transistors included in each column of said matrix being connected in series respectively, the insulated-gate field effect transistors included in each row of said matrix being connected in parallel respectively, said additional insulated-gate field effect transistors being connected respectively in parallel to the insulated-gate field effect transistors included in (m-1) numbers of said rows except for a single row of said matrix, the gates of said additional insulated-gate field effect transistors being connected to said first clock signal source, the gates of the insulated-gate field effect transistors arranged in said matrix being connected to said input terminals of said logic means respectively, the drains of the insulated-gate field effect transistors included in the first row of said matrix being connected to said output terminal of said logic means, and the sources of the insulated-gate field effect transistors included in said single row of said matrix being connected to ground.

* * * * *

UNITED STATES PATENT OFFICE
CERTIFICATE OF CORRECTION

Patent No. 3,909,627 Dated September 30, 1975

Inventor(s) Masatoshi Mizuno

It is certified that error appears in the above-identified patent and that said Letters Patent are hereby corrected as shown below:

In the Abstract

Last sentence should read: "The output signal of the circuit is derived from the source of the third transistor."

In the Claims

Claim 1, line 9, change "thrid" to -- third --;

Claim 6, line 12, after "two-phase" insert -- dynamic --;

Signed and Sealed this

*tenth* Day of *February 1976*

[SEAL]

*Attest:*

RUTH C. MASON
*Attesting Officer*

C. MARSHALL DANN
*Commissioner of Patents and Trademarks*

UNITED STATES PATENT OFFICE

CERTIFICATE OF CORRECTION

Patent No. 3,909,627 Dated September 30, 1975

Inventor(s) Masatoshi Mizuno

It is certified that error appears in the above-identified patent and that said Letters Patent are hereby corrected as shown below:

The assignee's name should read:

--NIPPON ELECTRIC COMPANY, LIMITED--

Signed and Sealed this

Thirteenth Day of July 1976

[SEAL]

*Attest:*

RUTH C. MASON
*Attesting Officer*

C. MARSHALL DANN
*Commissioner of Patents and Trademarks*